United States Patent [19]
Caracciolo

[11] Patent Number: 5,097,433
[45] Date of Patent: Mar. 17, 1992

[54] STACK FILTER WITH ONE STAGE PER BIT

[75] Inventor: Gerald T. Caracciolo, Columbus, N.J.

[73] Assignee: General Electric Company, Moorestown, N.J.

[21] Appl. No.: 551,112

[22] Filed: Jul. 11, 1990

[51] Int. Cl.⁵ ............................................. G06F 15/31
[52] U.S. Cl. ................................................ 364/724.01
[58] Field of Search ...................... 364/724.01, 724.16

[56]  References Cited
U.S. PATENT DOCUMENTS

| 4,589,019 | 5/1986 | Dischert et al. | 358/160 |
| 4,672,567 | 6/1987 | Kelly et al. | 364/724.01 |
| 4,868,773 | 4/1989 | Coyle et al. | 364/724.01 |

OTHER PUBLICATIONS

"Stack Filters", by Wendt et al., published in the IEEE Transactions on Acoustics, Speech and Signal Processing, vol. ASSP-34, No. 4, Aug. 1986.

"VLSI Implementation of a Fast Rank Order Filtering Algorithm", by Harber et al., published 1985 by the IEEE (CH 2118-8/85/0000-1396).

Primary Examiner—David H. Malzahn
Attorney, Agent, or Firm—William H. Meise

[57] ABSTRACT

A hierarchical stack filter performs nonlinear filtering operations such as median filtering and other rank-order filtering. The stack filter has a number of stages in the stack which equals the number of bits in the words of the input word sequence, and each filter of the stack receives as a first input signal a window of the input sequence. Each filter stage has an expansion input port and an expansion output port. Each filter stage calculates a residue and couples the residue from its expansion output port to expansion input port of the filter stage of next lesser significance.

6 Claims, 6 Drawing Sheets

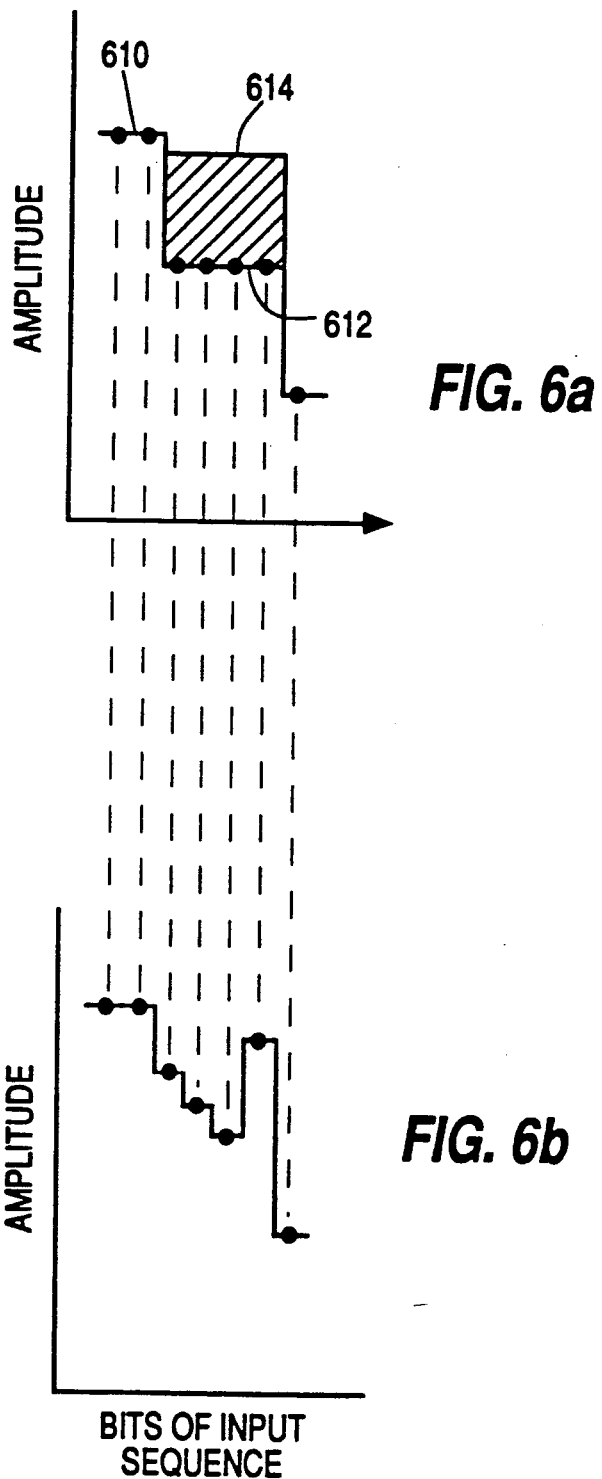

STACK FILTER WITH ONE STAGE PER BIT

This invention relates to stack filters for nonlinear filtration of digital signals by threshold decomposition and stacking.

Stack filters are used for the suppression of non-gaussian, non-additive noise. Such filters are used, for example, for the filtration of signals representative of images. Stack filters may be effectively implemented in very large scaled integrated circuits (VLSI), especially for implementation of the median average (that value for which equal numbers of samples have greater and lesser values) and for other general rank-order or order statistic operators. Salient characteristics of stack filters include capability for suppression of non-gaussian, non-additive or correlated noise, which are not amenable to filtering by linear filters. Also, stack filters are capable of suppressing impulse noise of both polarities or of a selected polarity, without the smearing of sharp edges of the desired signal as occurs in a linear filter.

As generally described in the article "Stack Filters" by Wendt et al., published at pages 898-911 of the IEEE Transaction On Acoustic, Speech and Signal Processing, Vol. ASSP-34, No. 4, Aug. 1986, the stack filter architecture includes a threshold decomposition portion, the actual filter portion, and an output reconstruction portion. In general, an N-bit binary number can be represented by its $2^N$ threshold value (for example an eight-bit binary number has 256 threshold values). Thus, each binary number may be imagined as forming a bar graph, with the height of the bar being a representation of the value of the binary number. Thus, a set or a sequence of such numbers may be considered to be equivalent to a set or a sequence of vertical bars, the lengths of which depend upon the values of the various binary numbers of the set or sequence. A set of such words, or a sequence corresponding to a set, defines a "window". Stack filters such as that described by Wendt includes a plurality of threshold decomposition arrangements for producing windows of data representing the various thresholds.

More particularly, a two-bit digital word is capable of representing four values, namely 0, 1, 2 and 3. Each word of a stream of such words may therefore take on one of three non-zero values, namely 1, 2 or 3. Threshold decomposition of a stream of two-bit words involves setting a threshold of 1, 2 and 3 to produce three separate streams of one-bit digital words, indicating whether the corresponding word of the two-bit stream has a value which exceeds 1, 2 and 3, respectively. Thus, a two-bit signal requires three thresholds. If the stream of digital words had three bits instead of two, it would be capable of representing seven non-zero values, and as a consequence, seven threshold circuits would be required. From this, it is easy to see that the number of threshold circuits, and therefore the amount of hardware required for performing the operations, grows with the order $2^N$, where N represents the number of bits in the words. A six-bit programmable rank-order stack filter is described in R. G. Harber, S. C. Bass, and G. L. Neudeck, "VLSI implementation of a fast rank-order algorithm", in Proceedings of the ICASSP 1985, Tampa, Fla., March 1985, pp 1396-1399. The Harber et al. stack filter uses analog and threshold logic circuit techniques to effect a single chip implementation, and requires 63 binary filter stages, together with circuits for decomposing and reconstructing 63 threshold levels. Extension of this prior art technique to a 16-bit filter would require 65,535 filters and decomposition and reconstruction of an equivalent number of threshold levels, which would require several hundred VLSI circuits at the current state of the art. Clearly, the prior art technique, while applicable to coarsely digitized signals, is impractical for filters which operate on signals with words having large numbers of bits. An improved stack filter is desired.

SUMMARY OF THE INVENTION

A set or a stream of N-bit digital words is filtered by a stack filter which includes N filter stages. Each of the filter stages of the stack includes first, second and third input ports and first, second and third output ports. At least one stage includes a data modifier with an output port and which also includes first, second and third data input ports. The first data input port of the data modifier has a number of bits equal to the number of words in the window or set of words being filtered, and is coupled to the first input port of the filter stage for receiving a bit of a particular significance from each word of the set of words being filtered. Each of the second and third data input ports of the data modifier has a number of bits equal to the number of words in the set of words being filtered, and is coupled to the second and third input ports of the filter stage for receiving output signals from the second and third output ports, respectively, of a filter stage of the stack filter which has the next higher significance. The data modifier individually and independently translates each of the bits of particular significance from its first data input port to the output port of the data modifier, in a form which is either modified or unmodified, as determined by corresponding bits of the output signals from the third output port of the filter stage of next higher significance. The data modifier therefore produces data at its output port which may be termed "modified data". Each filter stage also includes a combinatorial logic arrangement which includes an input port having a number of bits corresponding to a number of words in the set, and which also includes an output port which constitutes the first output port of the filter stage. The input port of the combinatorial logic arrangement is coupled to the data modifier for receiving modified data therefrom. The combinatorial logic arrangement responds to particular values of the modified data and not to other values, and generates an output signal at the first output port of the filter stage. A residue signal generator has first, second and third input ports, the first input port of which is coupled to the output port of the data modifier for receiving modified signals therefrom. The second input port of the residue signal generator is coupled to the third input port of the filter stage for receiving residue signal from the third output port of the filter stage of next higher significance. The third input port of the residue signal generator is coupled to the output port of the combinatorial logic arrangement. The residue signal generator compares the output of the combinatorial logic arrangement with each individual bit of the modified data, and for each such comparison produces a comparison signal representative of equality or inequality. The comparison signals are combined with the bits of the residue signal from the third output port of the filter stage of next higher significance to produce the residue signal of the filter stage for application to the third output port of the filter stage. In a particular embodiment of the invention, the data modifier is an array of multiplexers which independently selects the bits of the modified data from the data input or from the signal from the second output port of the filter stage of next higher significance, under the control of the state of the corresponding bit of the signal from the third output port of the filter stage of next higher significance. The combinatorial logic arrangement may include an array of AND gates, the inputs of which are connected in various permutations to the output of the data modifier, and the outputs of which are coupled to inputs of an OR gate. The residue signal generator may include an array of EXOR gates, one input of each of which is coupled to the output of the OR gate of the combinatorial logic arrangement, and another input of which is coupled to receive a bit of the modified data from the data modifier. The residue signal generator also may include an array of OR gates, each of which has a first input coupled to the output of a corresponding EXOR gate, and a second input coupled to receive a bit of the residue signal from a filter stage of next higher significance. The stage of greatest significance receives no inputs at its second and third input ports. The residue signal and the modified data produced by the filter stage of least significance are not used by further filter stages.

DESCRIPTION OF THE DRAWING

FIG. 6a represents the values of a coarse resolution component and its error range for the words of FIG. 6b.

DESCRIPTION OF THE INVENTION

Figure 1:
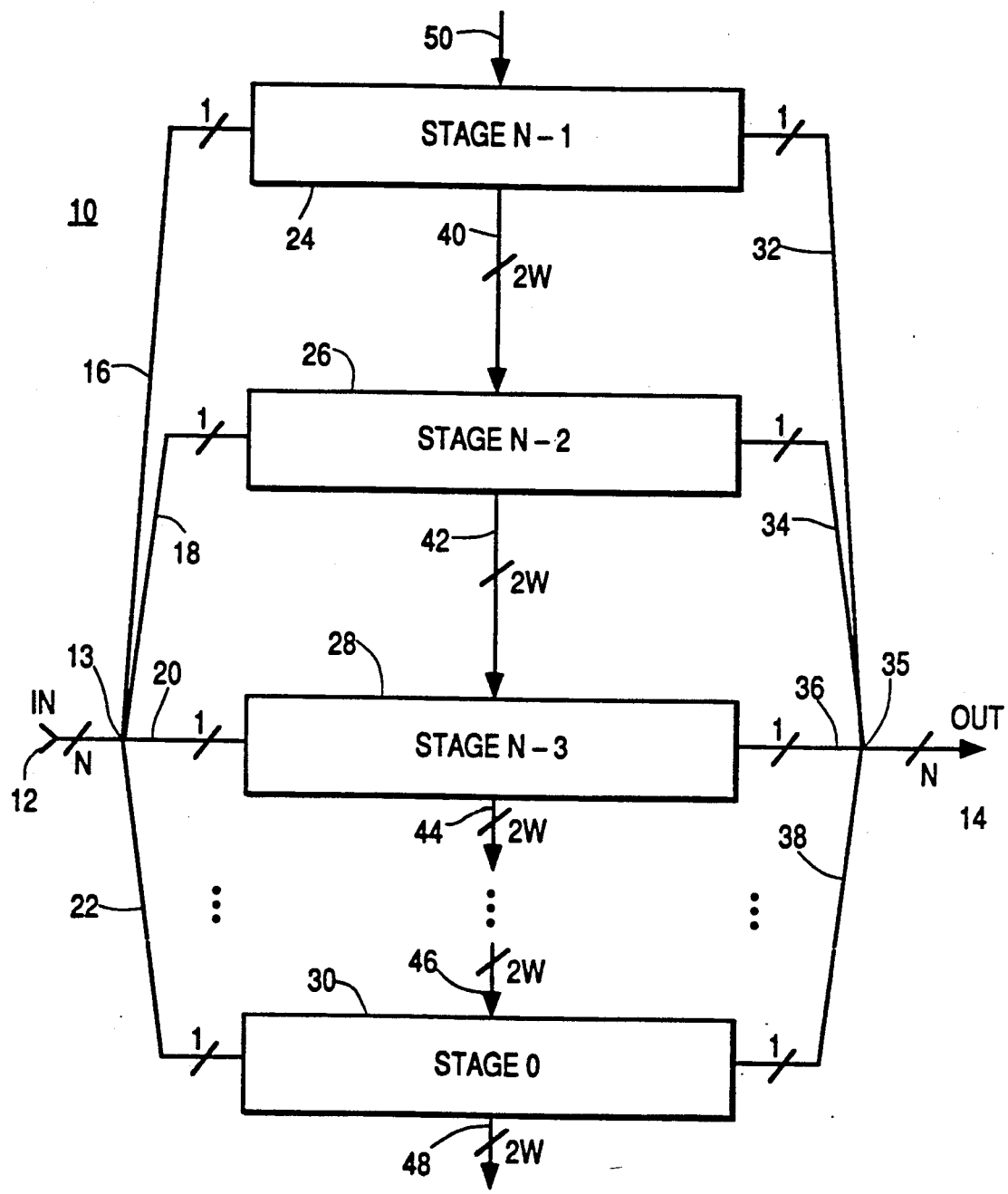
FIG. 1 illustrates in simplified block diagram form a stack filter according to the invention for filtering a stream of N-bit words.

FIG. 1 is a simplified block diagram of a stack filter 10 in accordance with the invention. In FIG. 1, a stream of N-bit signals is applied by way of an input port 12 to a junction point 13. At junction point 13, the bits are separated in order of significance and proceed, with the most significant bits (MSB) flowing along a one-bit data path 16 to a most significant stage 24, the next most significant bit proceeding along a one-bit data path 18 to the next most significant stage 26, a bit of lesser significance proceeding along a one-bit data path 20 to a stage 28, and with the least significant bit proceeding along a one-bit data path 22 to the least significant filter stage 30. As described below, filter stages 24, 26, 28 and 30, and additional stages (not illustrated) filter the bit of particular significance which they receive and produce outputs. An output of most significant stage 24 proceeds by way of a one-bit data path 32 to a junction point 35, the next most significant output bit is coupled from stage 26 along one-bit data path 34, and the one-bit output of stage 28 is coupled along data path 36 to junction point 35. Other stages, not illustrated, produce one-bit outputs which are coupled by data bits (not illustrated) to the junction point 35. Least significant stage 30 couples the least significant bit of the output by way of a data path 38 to junction point 35. At junction point 35, the data streams are combined into an N-bit stream for application to an output port 14.

In general, all filter stages of filter 10, except the most significant stage 24 and the least significant stage 30, receives inputs from an output of the stage of next higher significance, and couples outputs to the stage of next lower significance. For example, stage 26 of FIG. 1 receives output signals from stage 24 by way of a data path 40, and produces output signals which are coupled along a data path 42 to stage 28 of lower significance. The inputs to most significant filter stage 24 on data path 50 are left "unconnected" or tied to logic zero. The output from least significant stage 30 on data path 40 is left unconnected or not used.

Figure 2:
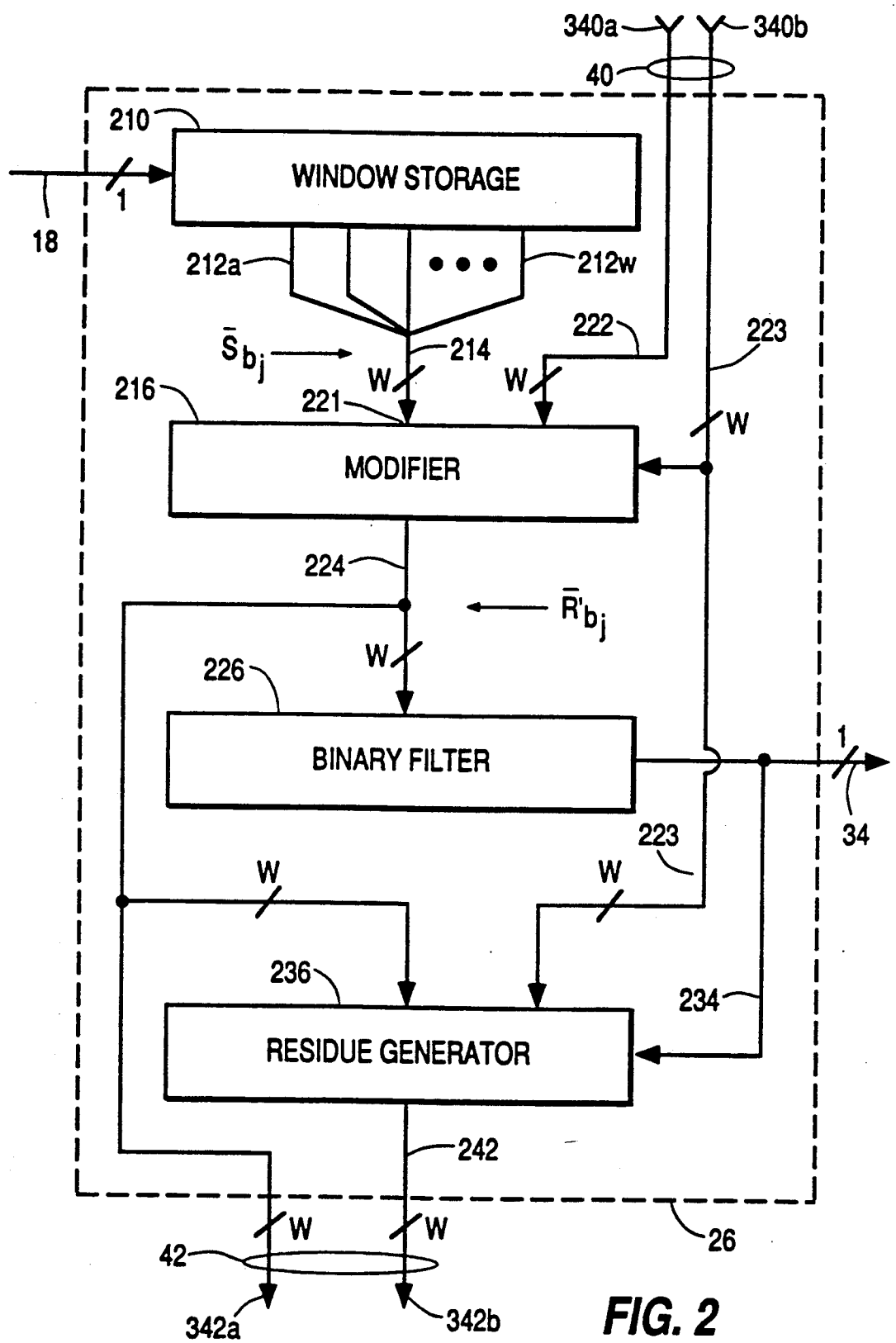
FIG. 2 is a simplified block diagram of a typical stage of the stack filter of FIG. 1.

FIG. 2 illustrates details of filter stage 26 of FIG. 1. Elements of FIG. 2 corresponding to those of FIG. 1 are designated by the same reference numerals. In FIG. 26, the one-bit stream of digital words is coupled over data path 18 to a window storage arrangement illustrated as a block 210. Window storage block 210 may be considered to be a delay line capable of storing a particular number of input words. It should be remembered that the words are only one bit wide at this point. A plurality of taps 212 sample all of the words from window storage block 210. The number of words simultaneously available is designated W, and constitutes the set upon which the filter operates. The combination of one-bit words constituting a set is designated $\bar{S}_{bj}$. The set of words is applied over a W-bit-wide data path 214 to a data modifier 216.

Data modifier 216 receives two W-bit-wide data streams over data paths 222 and 223 and by way of filter stage input port 40 from the output port (not illustrated) of the stage of next higher significance, corresponding to stage 24 of FIG. 1. For each bit of the W-bit signal applied over data path 214 to data modifier 216, there are two corresponding bits which are received over data paths 222 and 223. Data modifier 216 individually couples the W bits from data path 214 to data path 224 modified or unmodified depending upon the state of the corresponding bits received over data path 222 and 223. The modification of the data received by way of data path 214 may take the form of selectively coupling to data path 224 either the bit received from data path 214 or the corresponding bit received from data path 222. The modified data on data path 224 is designated $\bar{R}'_{bj}$ is applied to an input port of a binary filter 226, to an input port of a residue signal generator illustrated as a block 236, and as a W-bit output of stage 26, which is a portion of data path 42. Output port 42 of filter stage 26 is coupled to filter stages of lesser significance in the stack filter, such as filter stage 28 of FIG. 1.

Binary filter 226 responds to one or more predetermined configurations or patterns of the W bits received over data path 224 and produces a single output bit on output data path 34 when one of those patterns is encountered. Binary filter 226 includes combinatorial logic which can be expressed as a Boolean expression which contains no complements of the input variables. Such expressions may be termed "frontal functions" or "positive Boolean functions". The one-bit outputs of binary filter 226 are applied to output data path 34 and represent the output of the filter stage, which is combined with the outputs of other filter stages as described in conjunction with FIG. 1.

Residue signal generator 236 receives a one-bit signal from the output of binary filter 226 over a data path 234, and also receives the W-bit signal from expansion input data path 40 by way of data path 223, and further receive a W-bit signal from the output of data modifier 216 by way of data path 224.

Residue generator 236 individually and independently compares each bit of the W-bit modified data received from data modifier 216 by way of data path 224 with the one-bit signal produced on data path 234 by binary filter 226. If a bit of the modified data equals the bit at the output of binary filter 226, residue signal generator 236 uses the corresponding bit received from data path 223 as its output, and if the bits being compared are unequal, the corresponding output bit is forced to a logic 1.

Residue generator 236 produces a W-bit output signal which is applied over a W-bit data path 242 to expansion output port 42 for application to further stages of lesser significance (not illustrated in FIG. 2).

Figure 3:
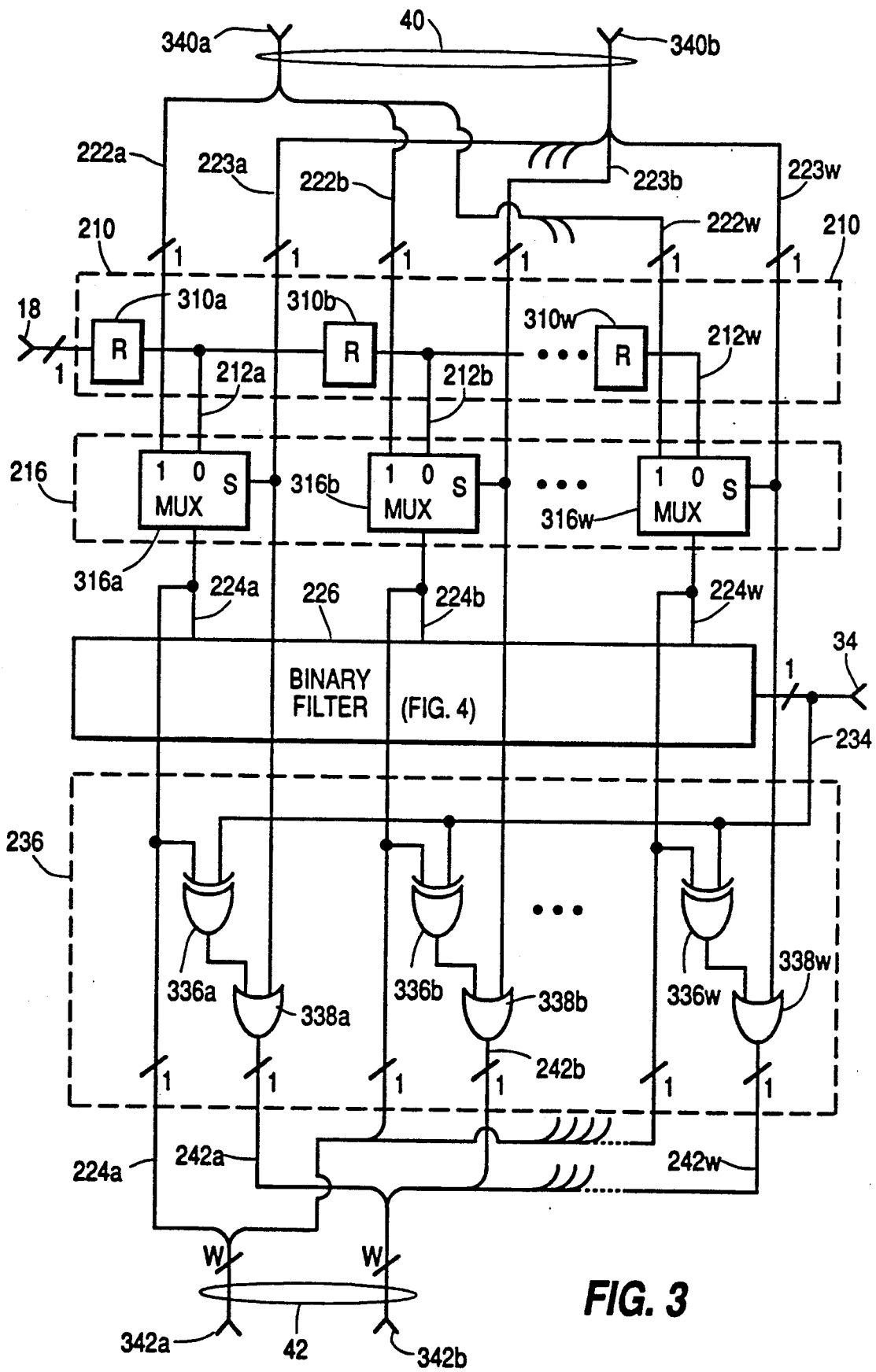
FIG. 3 is a more detailed diagram in block and schematic form of the arrangement of FIG. 2.

FIG. 3 illustrates details of the arrangement of FIG. 2. Elements of FIG. 3 corresponding to those of FIG. 2 are designated by the same reference numerals. In FIG. 3, the one-bit input signals applied to data input port 18 are applied to a cascade of one-bit registers (R) 310a, 310b, ... 310W of Window storage unit 210. Thus, after a sequence of W words has been applied, a window with a width of W and a depth of 1 bit is stored in unit 210 and is accessed by tap lines 212a, 212b ... 212W. As illustrated in FIG. 3, data modifier 216 includes a plurality of multiplexers (MUX) 316a, 316b, ... 316W. Each multiplexer 316 includes a pair of input terminals, designated "1" and "0" which are selectively coupled to its output data path 224 by the state of the signal applied to its select (S) input terminal. As illustrated in FIG. 3, the "1" input terminal of each multiplexer is coupled to the corresponding bit of data path 222 from expansion input port 40, while the "0" input port of each multiplexer is coupled to the corresponding data tap 212. Output data paths 224a, 224b ... 224W of multiplexers 316a, 316b, ... 316W, respectively, are coupled to inputs of binary filter 226, to portion 342a of expansion output port 42, and to the first inputs of a corresponding set of exclusive-or (EXOR) gates 336a, 336b ... 336W of residue signal generator 236. Second common by way of one-bit data path 234 to the output of binary filter 226. The output of each EXOR gate 336a, 336b ... 336W of FIG. 3 is coupled to an input of an OR gate 338a, 338b ... 338W, respectively, another input of which is coupled by way of one-bit data paths 223a, 223b ... 223W to portion 340b of expansion input port 40. One-bit output data paths 242a, 242b ... 242W of OR gates 338a, 338b ... 338W are collected together to form a W-bit output portion 342b of expansion output port 42.

In operation, each multiplexer 316a, 316b ... 316w couples its "1" or "0" input port to its output port, depending upon the state of the corresponding bit of the output signal from the output of the filter stage of next greater significance, received at the "S" input by way of a data path 223. Thus, the state of multiplexer 316a is controlled by the state of the signal from data path 223a, which is applied to the "S" input of multiplexer 316a and which originates from a data path which, in the next higher significance filter stage, corresponding to data path 342b of the filter stage of FIG. 3. When the S input of multiplexer 316a is high or logic 1, its "1" input is selected and coupled to the output, whereas if the S input is low or logic zero, the "0" input is selected.

Thus, the output signal of multiplexer 316a is individually selected, independently of the selection performed by any other multiplexer. Each multiplexer 316a, 316b . . . 316W thus selects either the corresponding input data from window storage unit 210 or the corresponding bit from portion 340a of expansion input port 40. The data so selected is applied to binary filter 226, which responds to some data patterns and not to others, to produce a logic one or a logic zero at its one-bit output for application to filter stage output port 34. Each EXOR gate 336 compares the one-bit output from binary filter 226 with a bit of modified data from a multiplexer 316, and responds to an equal-input-state condition for producing a logic zero which is coupled through an associated OR gate 338 together with inputs from portion 340b of expansion input port 40, to produce an output which is coupled by way of an output data path 242 to portion 342b of expansion output port 42.

Figure 4:
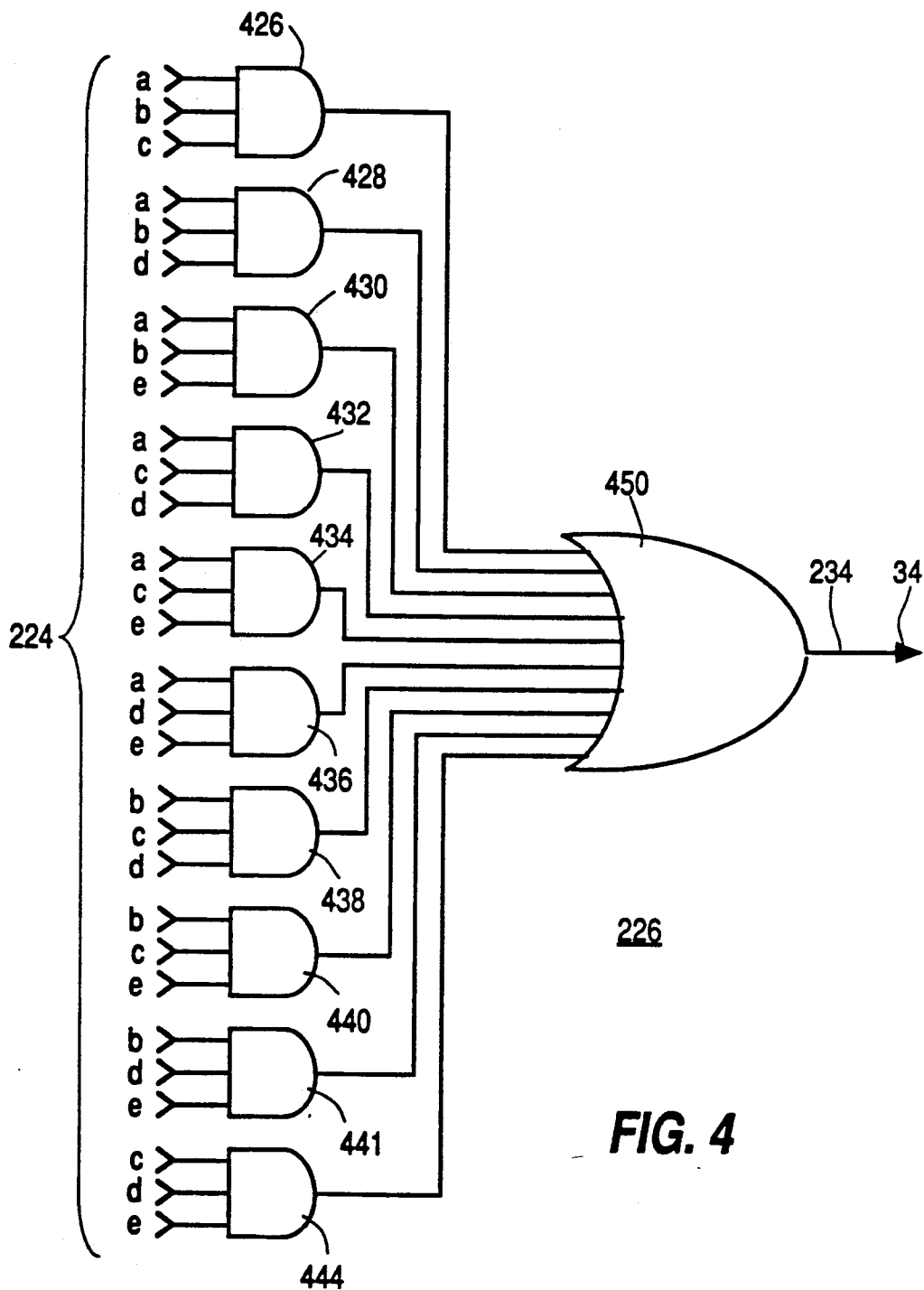
FIG. 4 is a more detailed diagram in schematic form of a combinatorial logic arrangement which may be used as a binary filter in the arrangement of FIG. 3 for median filtering.

FIG. 4 is a simplified schematic diagram of a binary median filter which may be used as binary filter 226 of FIG. 3. Elements of FIG. 4 corresponding to those of FIG. 3 are designated by the same reference numerals. Binary filter 226 as illustrated in FIG. 4 is configured to receive five one-bit data paths 224 whereby W, the window size, is five. Thus, input 224e of FIG. 4 corresponds to 224W of FIG. 3, and the other inputs in FIG. 4 are data paths 224a, 224b, 224c, 224d and 224e. In FIG. 4, ten AND gates 426–444 receive the input signals from data paths 224 in triplets, which triplets differ among the 10 AND gates. For example, AND gate 426 is connected to receive data from data paths 224a, 224b and 224c. No other AND gate has this particular combination of inputs. The inputs of each AND gate are permutations of triplets of inputs 224a, 224b, 224c, 224d and 224e, and all the permutations are different from each other. Thus, each AND gate 426 ... 444 responds to a different set of data and produces an output if that particular combination is found. The outputs of the AND gates are coupled to the input of a 10-input OR gate 450. OR gate 50 responds to the presence of an input from any one of AND gates 426–444 to produce an output on data path 234 for application to output port 34. Binary filter 226 as illustrated in FIG. 4 is for a binary median filter for a window size equivalent to five words. A logic 1 signal is generated at output 34 if at least three out of the five inputs is a logic 1, else the output is zero.

The first or most significant stage, such as stage 24 of FIG. 1, receives no inputs from its expansion input port 50. The last or least significant stage, such as stage 30 of FIG. 1, may produce outputs at its expansion output port 48, but the outputs are unused.

The hierarchical threshold decomposition accomplished by stack filters according to the invention have the advantage that the hardware growth rate increases by order N as word length N increases, which is a great improvement over the $2^N$ of the prior art. Also, explicit threshold decomposition and reconstruction steps are subsumed within the filter stages. Further, no analog threshold circuits are required.

Figure 5A:
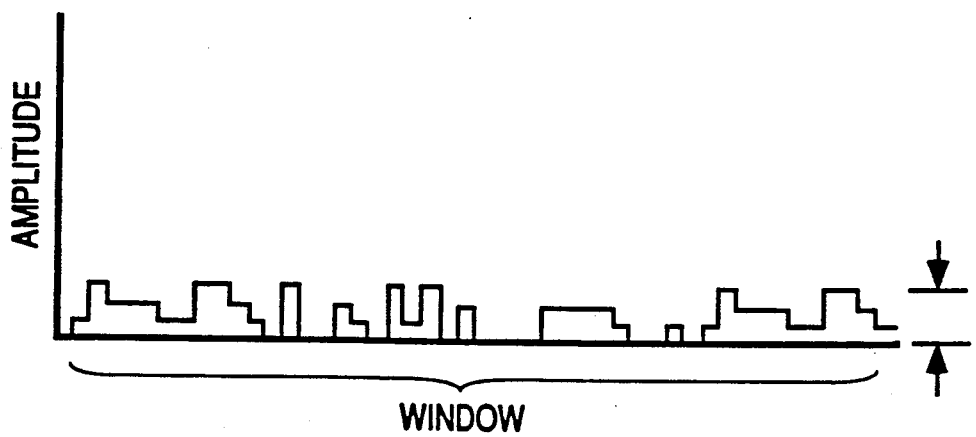
FIGS. 5a, 5b represent, respectively the values of a fine resolution component and a coarse resolution component of,, a set of words representing words having the values of FIG. 5c.
Figure 5B:
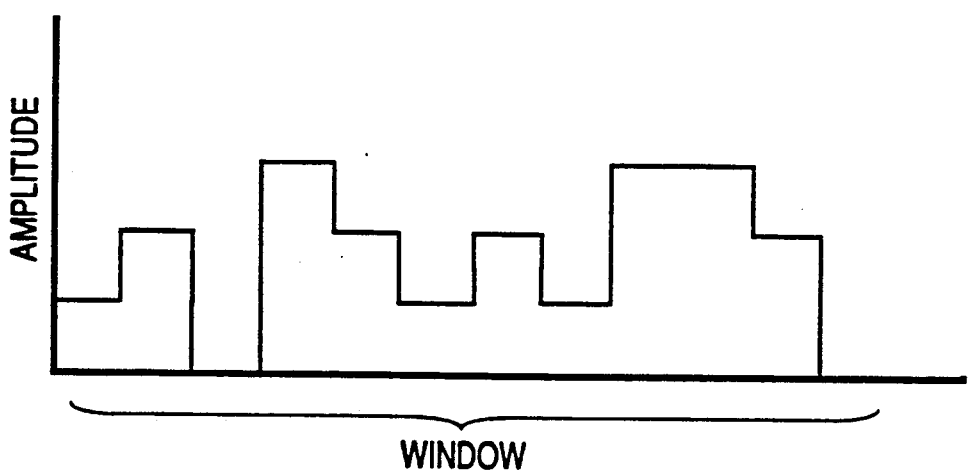
Figure 5C:
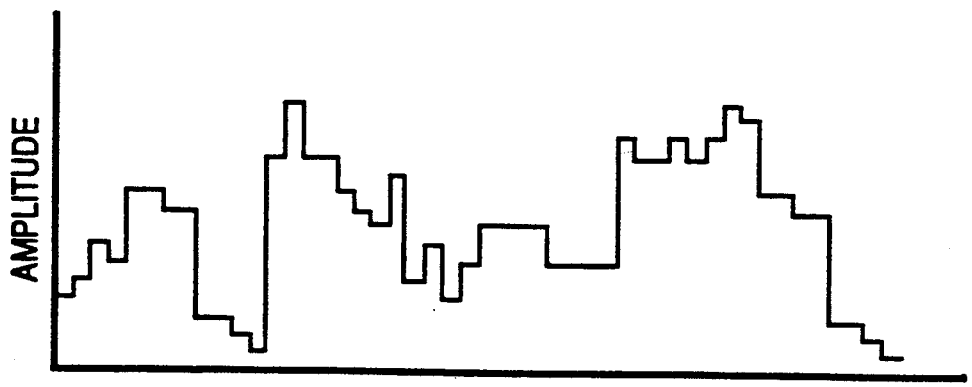

The theoretical background may be understood by considering a windowed portion of an input sequence of unsigned numbers $Sw=(s1, s2 \ldots , sw)$. A filtering function F, which obeys the stacking property set forth in the aforementioned Wendt et al. paper, is performed on the values $$F(Sw)=F(Swc+Swf) \quad (1)$$

where $\bar{S}wc$ and $\bar{S}wf$ are the coarse and fine resolution components, respectively, of the words of the windowed sequence. FIG. 5b illustrates the values of a coarse resolution component representing the digits of greater significance (as for example the M most significant bits) of a sequence of words illustrated in FIG. 5c, and FIG. 5a illustrates a fine resolution component representing the digits of lesser significance (as for example the N least significant bits).

As a consequence of the stacking property, the complete input sequence $F(\bar{S}w)$ may be approximated to within a predetermined number of bits of resolution by coarse component $F(\bar{S}wc)$, because the output error is bounded by the maximum range of the fine resolution component;

$$\text{error: } E < 2^N \qquad (2)$$

or more precisely $$0 \leq E \leq 2^N - 1 \qquad (3)$$

This implies that the stack filter output would always be at least as large as the stack filter output resulting from filtering the coarse sequence. This may be understood by considering that the coarse and fine resolution sequences of FIGS. 5b and 5a, respectively, can be "stacked" on top of each other as illustrated in FIG. 5c. Superposition or "stacking" of the two results in the composite signal of FIG. 5c, which has an amplitude greater than or equal to the coarse component illustrated in FIG. 6b. Therefore, $$F(\bar{S}w) = F(\bar{S}wc + \bar{S}wf) = F(\bar{S}wc) + E \qquad (4)$$

FIG. 6a illustrates as a plot 610 a coarsely quantized representation of a filter output, in which the maximum possible error from coarse quantization level 612 is represented by cross-hatched region 614. The magnitude of the error is established by the magnitude of the fine quantization component. In general, the maximum error will be slightly less than the magnitude of the step between coarse quantization levels.

The error may be quantified. As mentioned, the error is bounded by $2^N - 1$ where N is the number of bits in the fine resolution component of the input sequence. Additional information needed to correct for error E is contained in the range of values of the words of the windowed input sequence between $F(\bar{S}wc)$ and $F(\bar{S}Wc) + (2^N - 1)$. For each new windowed sequence, $F(\bar{S}wc)$ acts as a variable or floating threshold which establishes the region to which error correction information applies.

If the value $F(\bar{S}wc)$ is subtracted from the value of each word within the windowed sequence, a sequence of "residues" is generated $$r_1 = s_1 - F(\bar{S}wc)$$

$$r_2 = s_2 - F(\bar{S}wc)$$

$$r_i = s_i - F(\bar{S}wc)$$

$$r_w = s_w - F(\bar{S}wc)$$

where $s_1, s_2, \ldots s_i \ldots s_w$ represent sample values within the window.

This subtraction effectively shifts the baseline of the residues to a value of zero, with the range of residues extending from zero to $2^N - 1$. Since $F(\bar{S}wc)$ may be larger or smaller than the value $s_i$ of any word of the windowed input sequence, the residues $r_i$ may take on positive, negative, or zero values when the subtraction is performed. Also, $s_i$ may be large enough so that, when $F(\bar{S}wc)$ is subtracted, the residue $r_i$ may be larger than the error band ($2^N - 1$). The residue may therefore lie within or without the error band.

By definition, the error band must lie within $2^N - 1$, and those residues which fall below the baseline are considered to be zero, while those exceeding the $2^N - 1$ error band are considered to be $2^N - 1$, i.e. they are clipped. In FIG. 3, the clipping is accomplished by OR gates 338.

By substituting $sfi + sci$ for $si$, equation (5) may be rewritten as $$r_1 = sf1 + (sc1 - Fc) = sf1 + rc1$$

$$r_2 = sf2 + (sc2 - Fc) = sf2 + rc2$$

$$r_i = sfi + (sci - Fc) = sfi + rci \qquad (6)$$

$$r_w = sfw + (scw - Fc) = sfw + rcw$$

where $sf1, sf2 \ldots sfi \ldots sfw$ represent the fine resolution component of sample values within the window, and $sc1, sc2 \ldots sci \ldots scw$ represent the coarse resolution component of sample values within the window.

In Equation (6), $sci$ and $Fc$ have resolution equal to the M most significant bits, while $sfi$ has resolution equal to the N least significant bits. The magnitude of the smallest non-zero contribution of a coarse term $rci$ is $2^N$, the largest possible contribution of the fine resolution component. The values of fine component $sfi$, representing the N least significant bits Of the windowed sequence, have a maximum value of $2^N - 1$. Therefore, a residue lies in the error bond if and only if $rci$ is identically zero, in which case $r_i$ equals $sfi$.

A window modify function $wm$ is defined $$Wm(x,y) = \begin{cases} 2^N - 1 & \text{for } y > 0 \\ x & \text{for } y = 0 \\ o & \text{for } y < 0 \end{cases} \qquad (7)$$

where x and y are dummy variables used to define the function.

A new variable $r_i$ is defined as $$ri = Wm(sfi, rci) \qquad (8)$$

The sequence of values $\bar{R}' = (ri', r2' \ldots ri \ldots rw')$ contains the information necessary to correct for the error E, and that information is $F(\bar{R}')$. Consequently, equation 4 can be rewritten as $$F(\bar{S}w) = F(\bar{S}wc + \bar{S}wf) = F(\bar{S}wc) + F(\bar{R}') \qquad (9)$$

Since $F(\bar{S}wc)$ contributes only to the M most significant bits while $F(\bar{R}')$ contributes only to the N least significant bits, the summation described by equation 9 can be reduced to a bit concatenation operation, i.e. simply joining together the words to make a single word, as the words 10110 and 0011 may be joined to make the single word 10110011.

$$F(\bar{S}w) = F(\bar{S}wc + \bar{S}wf) = F_m(\bar{S}wc) \text{concat } F_N(\bar{R}') \quad (10)$$

where
$F_M(\bar{S}wc)$ is performed on the M most significant bits, and
$F_N(\bar{R}')$ is performed on the N least significant bits.

Equation 10 effectively states that a stack filtering operation to be performed on an (M+N)-bit sequence can be performed by concatenating the outputs of two separate stack filtering operations, a first M-bit filter for the most significant M bits, and second N-bit filter for a modified sequence $\bar{R}'$ derived from the last significant bits.

The decomposition of the filtering into MSB and LSB portions is continued until, in the limit, M=1 and N=1 for each filter. At this level, all coarse and fine sequences are binary sequences, and they are N in number for an N-bit input sequence. Filtering them requires one filter per bit of word length. Since all the sequences are binary, no explicit threshold decomposition or reconstruction is necessary.

The modified sequence $\bar{R}'$ which is applied to the fine or least significant filter section of a pair is a function of the residues $\bar{R}$ produced by the coarse or more significant filter section of the pair, and may be expressed as $$\bar{R}'bj = W_m(\bar{S}bj, \bar{R}bj+1) \quad (11)$$

where
$\bar{R}'bj$ is the modified windowed sequence to the input of the jth binary filter;
$\bar{S}bj$ is the windowed binary input sequence to the jth binary filter; and
$\bar{R}bj+1$ is the sequence of residues from the more significant j+1st binary filter.

Equation 11 implies recursion in obtaining the modified windowed input sequences for each binary filter stage, starting with the most significant stage and working toward the least significant stage. When implemented in a hardware form as depicted in FIGS. 1-4, the recursion is manifested as a ripple delay from the most significant stage to the least significant stage.

Other embodiments of the invention will be apparent to those skilled in the art. For example, window storage unit 210 of FIGS. 2 and 3 may be dispensed with if the set of input data W words wide is available simultaneously on W data paths to data modifier 216.

What is claimed is:

1. A filter for a first plurality of N-bit digital words constituting a set of words, said filter including N filter stages, each of which stages includes first, second and third input ports and first, second and third output ports, and each of which stages is coupled to receive at its said first input port a bit of predetermined significance from each of said digital words of said set, at least one of said stages comprising:
    data modifying means including an output port coupled to said second output port of said filter stage and also including first, second and third data input ports, said first data input port having a number of bits equal to said first plurality and being coupled to said first input port of the filter stage for receiving said bit of predetermined significance from each of said digital words of said first plurality of digital words of said set, each of said second and third data input ports also having a number of bits equal to said first plurality, said second and third data input ports of said data modifying means being coupled to said second and third input ports of the filter stage, respectively, for receiving output signals from the second and third output ports, respectively, of a filter stage of next higher significance, said data modifying means being for individually translating each of said bits from said first data input port of said data modifying means to said output port of said data modifying means in one of an unmodified manner in a first mode of operation and in a modified manner in a second mode of operation, said first and second modes of operation for each of said first plurality of bits being established by the state of corresponding bits of said output signals from said second and third output ports of said filter stage of next higher significance which are applied to said second and third input ports, respectively, of said data modifying means, to thereby produce modified data at said output port of said data modifying means and at said second output port of the filter stage;
    combinatorial logic means including an input port having a number of bits corresponding to said first plurality and also including an output port coupled to said first output port of the filter stage, said input port of said combinatorial logic means being coupled to said output port of said data modifying means for receiving said modified data therefrom, for responding to particular values of said modified data and not to other values, and for generating a first output signal at said output port of said combinatorial logic means for application to said first output port of the filter stage;
    residue signal generating means including first, second and third input ports, said first and second ports having a number of bits corresponding to said first plurality, said third input port of said residue signal generating means being coupled to said output port of said combinatorial logic means and having a corresponding number of bits, said first input port of said residue generating means being coupled to said output port of said data modifying means for receiving said modified data therefrom, and said second input port of said residue generating means being coupled to said third input port of said filter stage for receiving said output signal from said third output port of said stage of next higher significance, said residue signal generating means also including an output port coupled to said third output port of the filter stage, for generating a comparison signal representative of a comparison of each bit of said modified data with said first output signal generated by said combinatorial logic means, and for combining said comparison signal with said output signal from said third output port of said filter stage of next higher significance to generate a residue signal at said output port of said residue signal generating means for application to said third output port of the filter stage.

2. A filter according to claim 1, wherein said output port of said combinatorial logic means is a one-bit output port.

3. A filter according to claim 1, wherein said first plurality of N-bit digital words is generated in a time-sequential manner, and each of said filter stages further comprises:

register means including a one-bit input port adapted to receive said time-sequential words and coupled to a cascade of registers equal in number to said first plurality, and also including an output port having a number of bits equal to said first plurality, each of said bits of said output port of said register means being coupled to a corresponding one of said registers and to a corresponding one of said bits of said first input port of said data modifying means of the filter stage, for temporarily storing a bit of said predetermined significance from each of said N-bit digital words in a time-sequential manner, for thereby generating a window of data derived from a number of input words equal to said plurality, and for making said window of data available to said data modifying means of the filter stage.

4. A filter according to claim 1, wherein said data modifying means comprises:

a plurality of multiplexing means equal in number to said first plurality, each of said multiplexing means including first and second input ports, an output port and a control input port, each of said multiplexing means being for coupling one of said first and second input ports of said multiplexing means to said output port of said multiplexing means under the control of the state of a signal coupled to said control input port, said first input ports of said plurality of multiplexing means together constituting said first input port of said data modifying means, said second input ports of said plurality of multiplexing means together constituting said second input port of said data modifying means, said control input ports of said multiplexing means being coupled to said third input port of the filter stage for receiving said output signal from said third output port of said filter stage of next higher significance, and said output ports of said plurality of multiplexing means together constituting said output port of said data modifying means, whereby bits of one of said output signals from said second and third output ports of said stage of next higher significance are individually and independently coupled to said output port of said data modifying means under the control of said state of said corresponding bits of said output signals from said third output port of said filter stage of next higher significance.

5. A filter according to claim 1 wherein said combinatorial logic means comprises:

an array of AND gates, each of said AND gates including an output port and also including an input port having a number of bits no greater than said plurality, said input ports of each of said AND gates of said array of AND gates being coupled to a different set of bits of said output port of said multiplexing means;

an OR gate including an output port and also including an input port, each bit of which input port is coupled to said output port of one of said AND gates of said array of AND gates; and means coupling said output port of said OR gate to said output port of said combinatorial logic means.

6. A filter according to claim 1, wherein said residue signal generating means comprises:

an array of a plurality of EXOR gates, each of said EXOR gates including an output port and a plural-bit input port, a first portion of said input port of each of EXOR gates of said array of EXOR gates together constituting said first input port of said residue signal generating means, and a second portion of said input port of each of said EXOR gates of said array of EXOR gates together constituting said third input port of said residue signal generating means, whereby said first portions of said input ports of said EXOR gates of array of EXOR gates are coupled to said output port of said data modifying means and said second portions of said input ports of said EXOR gates of array of EXOR gates are coupled in common to said output port of said combinatorial logic means, for generating a portion of said comparison signal at the output of each of said EXOR gates;

an array of OR gates, each of which includes an input port and an output port, a first portion of said input port of each of said OR gates of said array of OR gates being coupled to the output port of a corresponding one of said EXOR gates of said array of EXOR gates, second portions of said input ports of said OR gates of said array of OR gates together constituting said third input port of said residue signal generating means, and the combination of said output ports of said OR gates of said array of OR gates together constituting said output port of said residue signal generating means.

* * * * *